(12) United States Patent
Tsai et al.

(10) Patent No.: US 6,410,424 B1
(45) Date of Patent: Jun. 25, 2002

(54) PROCESS FLOW TO OPTIMIZE PROFILE OF ULTRA SMALL SIZE PHOTO RESIST FREE CONTACT

(75) Inventors: Ming-Huan Tsai, Chupei; Chung-Long Chang, Dou-Liu; Chii-Ming Wu, Taipei; Hun-Jan Tao, Hsinchu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/837,599

(22) Filed: Apr. 19, 2001

(51) Int. Cl.⁷ .......................................... H01L 21/4763
(52) U.S. Cl. ........................................ 438/637; 438/975
(58) Field of Search .......................... 438/552, 637, 438/639, 672, 675, 680, 689, 692, 695, 696, 697, 706, 740, 745, 905, 975

(56) References Cited

U.S. PATENT DOCUMENTS

| | | | |
|---|---|---|---|
| 5,484,740 A | * 1/1996 | Cho | 438/637 |
| 5,611,888 A | 3/1997 | Bosch et al. | 156/643.1 |
| 5,766,984 A | * 6/1998 | Ramm et al. | 438/109 |
| 6,077,790 A | 6/2000 | Li et al. | 438/739 |
| 6,103,456 A | * 8/2000 | Tobben et al. | 430/317 |
| 6,127,070 A | * 10/2000 | Yang et al. | 430/5 |
| 6,147,007 A | * 11/2000 | Yang et al. | 438/723 |

* cited by examiner

*Primary Examiner*—David Nelms
*Assistant Examiner*—David Nhu
(74) *Attorney, Agent, or Firm*—George O. Saile; Stephen B. Ackerman (57) ABSTRACT

A new processing sequence is provided for the creation of openings in layers of dielectric. Over a semiconductor surface are successively deposited an etch stop layer, a layer of dielectric and a hard mask layer. An opening is etched in the hard mask layer, the main opening is etched through the layer of dielectric and the etch stop layer. The surface is wet cleaned, after which a thin layer of silicon oxide is CVD deposited over the inside surfaces of the created opening. This thin layer of CVD oxide is subjected to argon sputter, providing of the critical dimensions of the upper region of the opening. Then the process continues with the deposition of the barrier metal, the filling of the opening with a conducting material to create the metal plug and the polishing of the surface of the deposited conducting material.

26 Claims, 6 Drawing Sheets

PROCESS FLOW TO OPTIMIZE PROFILE OF ULTRA SMALL SIZE PHOTO RESIST FREE CONTACT

BACKGROUND OF THE INVENTION

1. Field of the Invention

The invention relates to the fabrication of integrated circuit devices, and more particularly, to a method of etching contact holes whereby improved control of the Critical Dimensions of the opening of the contact hole is achieved.

2. Description of the Prior Art

With the continued decrease in semiconductor devices and the dimensions of the elements that are part of these devices, it is becoming increasingly more difficult to create openings in the various layers of the devices such that these openings do not interact around the upper perimeter of the openings. To avoid such interaction for very closely spaced openings, it is therefore not only important that merging of densely spaced openings is avoided but that in addition the openings are created having extremely vertical walls while being devoid of rounding of the walls of the openings where these walls approach the upper regions of the openings.

Increased semiconductor density has over the years resulted in the creation of multilevel devices wherein overlying metallic conductive layers are used to interconnect device elements. The adjacent and overlying patterns of interconnect metal are separated by layers of Inter Metal Dielectric (IMD), connections between adjacent and overlying layers of interconnect metal are established by creating contact holes or vias through the layers of IMD. By filling the holes or vias with a conductive material such as metal, overlying interconnect lines are connected together forming an interconnect network of increased functional capability.

With the extreme reduction in device features, the contact holes and vias must be created such that the openings of these holes and vias are as small as possible. With submicron device features, these openings have been reduced to having a diameter of 0.25 $\mu$m of less. For such small openings, borderless contact holes are most frequently used in order to optimize the use of the available surface area of the semiconductor surface into which the hole is created. Openings that are created through overlying layers of semiconductor material are created in order to make electrical contact with a point of contact that is provided at the bottom of the opening. For instance, holes can be created through a layer of IMD to contact source and drain regions or the gate electrode of a Metal Oxide Semiconductor (MOS) device. Etch stop layers, typically comprising silicon nitride, are used to control the depth of the etch that is performed through the layer of IMD. The method of choice that is most frequently used to create openings uses photolithography whereby a pattern that is contained in a mask is transferred to a radiation sensitive medium, such as photoresist. The processing sequence can be summarized as follows: a semiconductor surface, most typically the surface of a monocrystalline silicon substrate, is provided, points of electrical contact have been provided in or on the surface of the substrate. A layer of etch stop material, such as silicon nitride, is deposited over the surface of the substrate, a layer of dielectric such as silicon oxide is deposited over the surface of the etch stop layer. A layer of photoresist is deposited over the layer of dielectric and exposed by a light source that exposes the surface of the layer of photoresist through a mask. The regions of the layer of photoresist that are exposed by the light source change in their molecular composition such that this exposed photoresist can be readily removed from the surface of the layer of dielectric. After this exposed photoresist has been removed, the layer of dielectric can now be etched, stopped by and thereby partially exposing the surface of the etch stop layer in a pattern that aligns with the points of electrical contact that have been provided in the surface of the substrate. By removing the etch stop layer from the bottom of the openings that have been created through the layer of dielectric, the points of electrical contact in the surface of the substrate are exposed. Filling the openings in the layer of dielectric with a electrically conductive material such as metal and polishing this layer of electrically conductive material down to the surface of the layer of dielectric leaves in place electrically conductive plugs through the layer of dielectric that contact the points of electrical contact in the surface of the substrate. The layer of conductive material that has been deposited to fill the openings that have been created in the layer of dielectric can further be patterned and etched, interconnecting the conductive plugs with an overlying network of interconnect lines.

The technology of photolithography has also been adopted in order to create openings of smaller dimension and in a denser pattern of openings. Smaller wavelengths for the exposing light source, such as the use of Extreme Ultra Violet (EUV) light with a wavelength of about 50 to 700 Angstrom, has been applied for this purpose. This approach however has the limitation that shorter wavelengths of the exposing light source limits the depth to which the light can penetrate the exposed surface, such as the surface of a layer of photoresist. This in turn limits the thickness of the layer of photoresist that can be used, which limits the etch protection that the layer of photoresist provides.

It has previously been stated that the method of photoresist uses a mask to transpose a pattern that is contained in the mask to a surface, such as the surface of a layer of photoresist. This brings with it the requirement that the image that is created by the mask on the exposed surface must be positioned (aligned) with extreme accuracy so that the exposed surface of the layer of photoresist aligns most closely with the points of electrical contact to which a conductive plug must be established. For practical applications, some consideration must therefore be given to misalignment of the exposure mask with the target points of electrical contact. For this reason, regions that must not be etched and where no opening for a contact plug is to be created are at times surrounded with an etch resistant material so that incorrect alignment still allows for the creation of holes of proper alignment.

The methods of etching that have most recently been used for the creation of the openings for contact plug are methods of dry etching such as plasma etching and Reactive Ion Etching (RIE). These methods of dry etching can be highly selective in the materials that are being etched but can also provide an etch that is highly anisotropic, resulting in holes that have nearly vertical sidewalls. However, dry etches are expensive due to the high cost of Reactive Ion Etching (RIE) systems and are limited in application because they require a hard mask.

A hard mask is used in the creation of semiconductor features because it is opaque to the photochemical light that is used in photolithography. Light will therefore not be reflected from the hard mask layer which, in typical applications that use for instance polysilicon or polycide as layers of conductive material, causes a problem of light diffusion and therefore poor definition of the exposed pattern with a resulting poor definition of the hole that is created.

The basic procedure that is used for a sequence of dry etching uses a processing chamber into which the semiconductor surface, on which the various layers that need to be etched have been deposited, is positioned on a first electrode. A second electrode of the processing chamber is positioned opposite the first electrode. A gaseous medium containing the etchant gasses is passed through the processing chamber while at the same time a rf voltage is applied between the first and the second electrodes in order to activate (ionize) the etchant gasses, forming a plasma that etches the layers on the surface of the semiconductor surface. The etchant gasses are selected for optimum results and are dependent on the material of the layer that needs to be etched. By proper selection of these gasses, selective and anisotropic etching of the successive layers can be accomplished.

U.S. Pat No. 6,127,070 (Yang et al.) shows a via etch process using a nitride hard mask.

U.S. Pat. No. 5,611,888 (Bosch et al.), U.S. Pat. No. 6,077,790 (Li et al.) and U.S. Pat No. 6,147,007 (Yang et al.) show other via etch process using hard masks.

SUMMARY OF THE INVENTION

A principle objective of the invention is to provide a method for the creation of openings whereby improved control of the Critical Dimensions (CD) of the opening is achieved.

Another objective of the invention is to provide a method for the creation of ultra-small openings whereby these openings can be created in a dense pattern without causing problems of merging of adjacent openings.

Yet another objective of the invention is to provide a method for the creation of ultra-small openings whereby rounding of the upper regions of the sidewalls of the openings is reduced, thereby reducing the occurrence of key holes in the formation of metal plugs inside these openings.

In accordance with the objectives of the invention a new processing sequence is provided for the creation of openings in layers of dielectric. The invention provides the steps of, over a semiconductor surface, depositing an etch stop layer over which a layer of dielectric is deposited over which a hard mask layer is deposited. A layer of photoresist is deposited and patterned on the surface of the hard mask layer, an opening is etched in the hard mask layer, the photoresist is removed after which the main opening is etched through the layer of dielectric and the etch stop layer. The surface is wet cleaned, after which, significantly as a processing step of the invention, a thin layer of silicon oxide is CVD deposited over the inside surfaces of the created opening. This thin layer of CVD oxide provides control of the critical dimensions of the upper region of the opening (that has been etched through the layer of dielectric and the etch stop layer) and further provides profile control of the opening itself. After this, the processing continues with a pre-barrier metal argon sputter. This pre-barrier metal argon sputter optimizes the profile of the cross section of the opening by partially removing the deposited thin layer of oxide from the sidewalls of the opening and by removing the thin layer of oxide from the bottom of the opening. Then the process continues with the deposition of the barrier metal, the filling of the opening with a conducting material to create the metal plug and the polishing of the surface of the deposited conducting material.

BRIEF DESCRIPTION OF THE DRAWINGS

FIGS. 1 through 7 address prior art procedure of creating an opening in a layer of dielectric, as follows:

FIGS. 8 through 11 address the invention, as follows:

FIGS. 12 though 18 show cross sections of an opening that more accurately reflect actual etching and deposition conditions, as follows:

DESCRIPTION OF THE PREFERRED EMBODIMENTS

The following method and sequence will be used in describing the invention. First will described, using FIGS. 1 through 7, the conventional processing steps that are used to create an opening in a layer of dielectric. This will be followed, using FIGS. 8 though 11, the processing steps where the invention deviates from the conventional procedures for the creation of an opening in a layer of dielectric. Finally, a number of cross sections, FIGS. 12 through 18, will be used to show the actual processing steps in a less idealized manner so that the invention becomes more clear.

Figure 1:
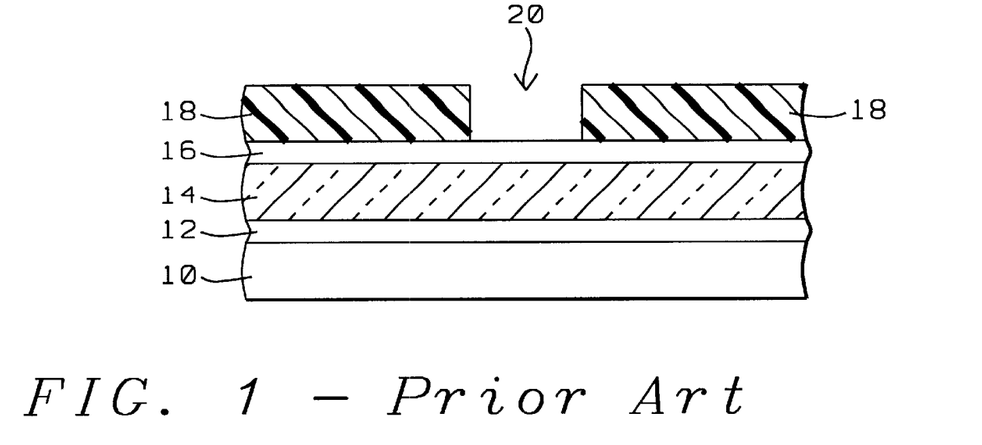
FIG. 1 shows a cross section of a semiconductor substrate on the surface of which have consecutively been deposited an etch stop layer, a layer of dielectric and a hard mask layer. A layer of photoresist has been deposited and patterned over the hard mask layer.

Referring now specifically to FIG. 1, there is shown a cross section of a semiconductor 10, preferably the surface of a monocrystalline semiconductor substrate, over which consecutively have been deposited a layer 12 of etch stop material, a layer 14 of dielectric and a layer 16 of hard mask material. As a final step in the creation of the cross section that is shown in FIG. 1, a layer 18 of photoresist has been deposited over the surface of the hard mask layer 16. The layer 18 of photoresist has been patterned and etched creating opening 20 in the layer of photoresist. Opening 20 aligns with a point of electrical contact that has been provided in the surface of layer 10 (not shown in FIG. 1) to which contact must be established.

Layer 12 of etch stop material preferably comprises oxynitride or silicon nitride. Hard mask layer 16 preferably comprises oxynitride and is preferably deposited using methods of LPCVD or PECVD or HDCVD or sputtering or High Density Plasma CVD (HDPCVD), deposited to a thickness between about 100 and 500 Angstrom. The hard mask layer can further comprise an element selected from the group consisting of titanium nitride and amorphous silicon, also deposited to a thickness between about 100 and 500 Angstrom.

Figure 2:
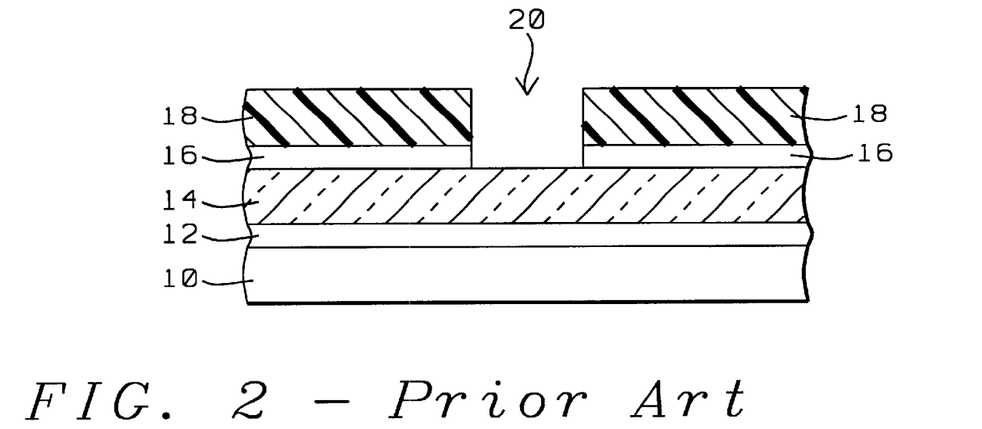
FIG. 2 shows a cross section after the hard mask layer has been etched in accordance with the pattern in the layer of photoresist.
Figure 3:
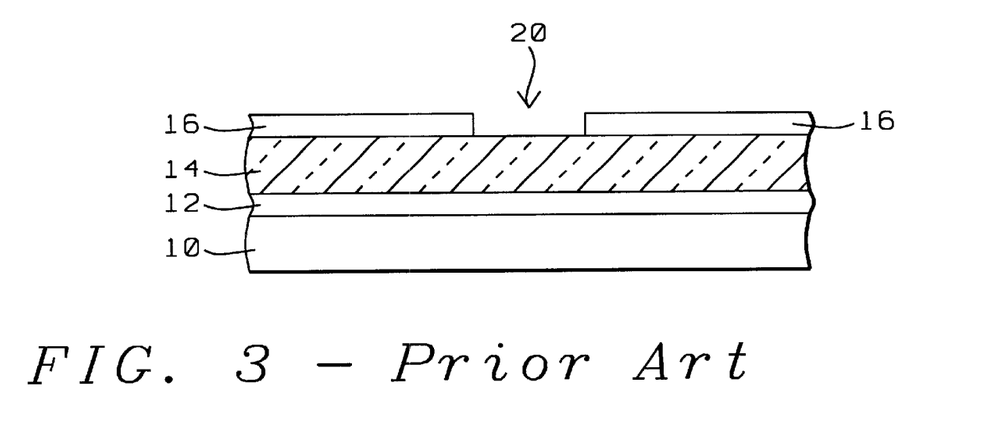
FIG. 3 shows a cross section after the patterned layer of photoresist has been removed from the surface of the hard mask layer.

FIG. 2 shows a cross section where the layer 16 of etch stop material has been etched in accordance with the opening 20 that has been created in the layer 18 of photoresist. FIG. 3 shows a cross section after the layer 18 of photoresist has been removed from the surface of the hard stop layer 16.

Figure 4:
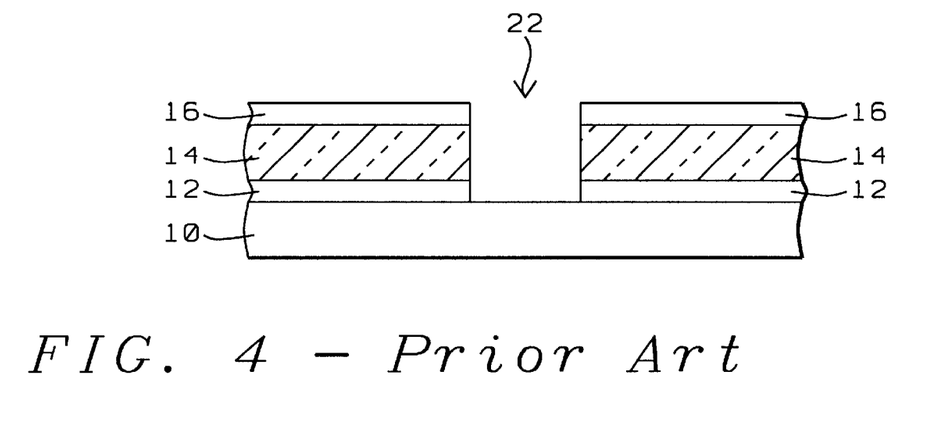
FIG. 4 shows a cross section after the layers of dielectric and the etch stop layer have been etched in accordance with the opening in the hard mask layer.

The main etch of the layer of dielectric and the etch stop layer is next performed as shown in cross section in FIG. 4. This main etch creates the opening 22 that is required for the contact plug that is to make contact with a point of electrical contact (not shown) that has been provided in the surface of layer 10. In order to be able to contact this contact point in the surface of layer 10, the etch stop layer has also been etched, exposing the point of contact (not shown) in the surface of layer 10.

After the steps that have been highlighted under FIGS. 1 through 4 have been completed, the substrate is subjected to a thorough cleaning in order to remove any residues from the surface and from the inside surfaces of the opening 22 that has been created.

Figure 5:
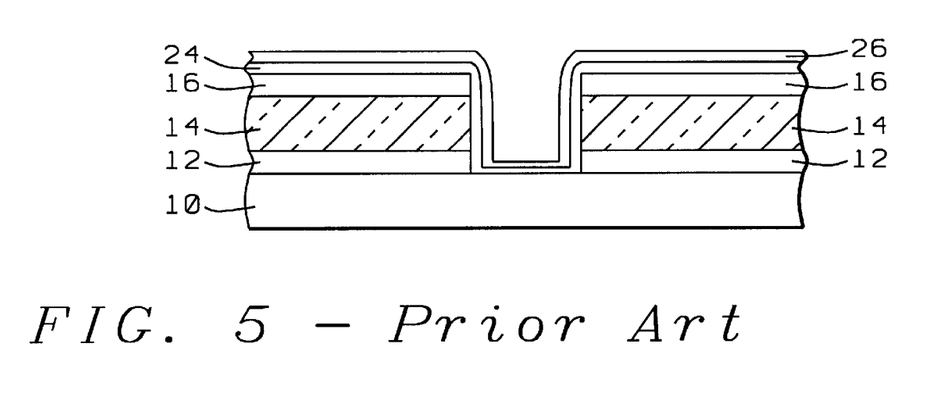
FIG. 5 shows a cross section after a pre-barrier metal sputter has been performed and after a layer of barrier material has been deposited.

FIG. 5 shows a cross section after a pre-barrier layer of argon have been sputter deposited over the exposed surfaces of the opening 22 and over the surface of the hard mask layer 16. This layer 22 is typically deposited to the thickness between about 100 and 200 Angstrom but preferably to a thickness of about 150 Angstrom. This layer is deposited in order to enhance adhesion between the conductive plug that is created in opening 20 and the surrounding dielectric 14. FIG. 5 also shows that the deposition of a barrier layer 26 over the surface of layer 24 has been completed.

Figure 6:
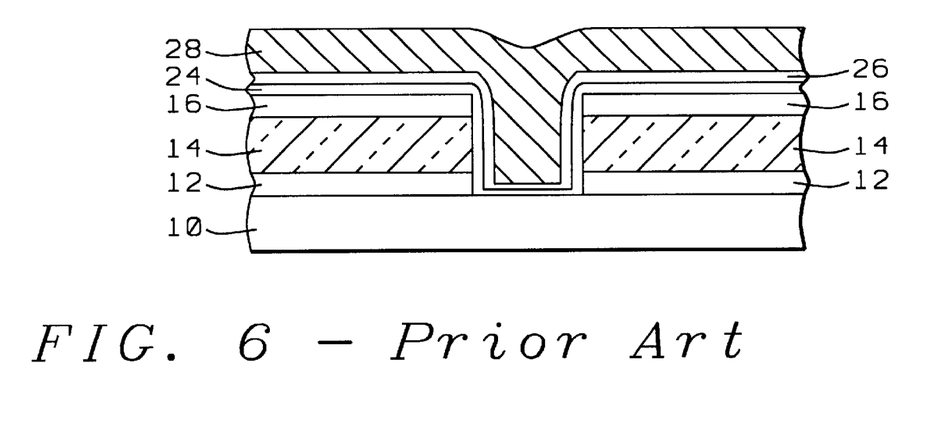
FIG. 6 shows a cross section after a layer of metal has been deposited over the structure of FIG. 5.
Figure 7:
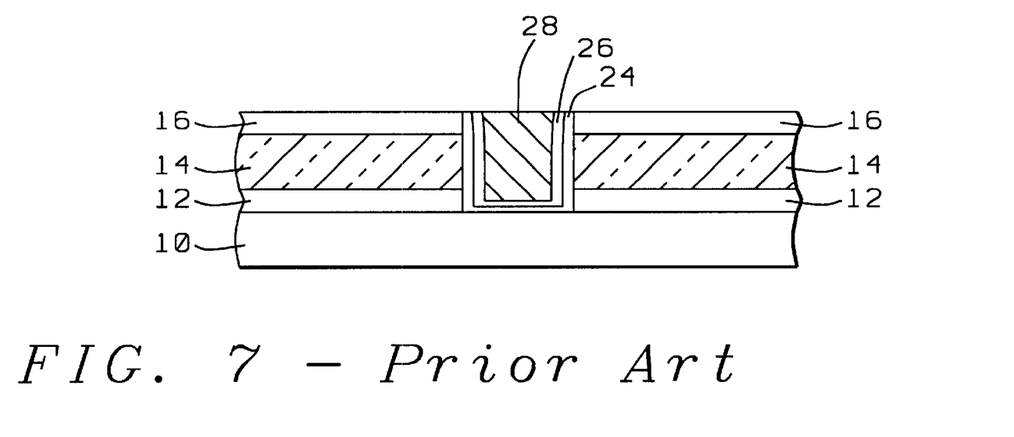
FIG. 7 shows a cross section after the deposited layer of metal has been polished down to the surface of the hard mask layer.

FIG. 6 shows a cross section wherein the opening 22 has been filled with a layer 28 of metal, FIG. 7 shows a cross section wherein the deposited layer 28 of metal has been polished down to the surface of the hard mask layer leaving in place the metal plug 28.

Figure 8:
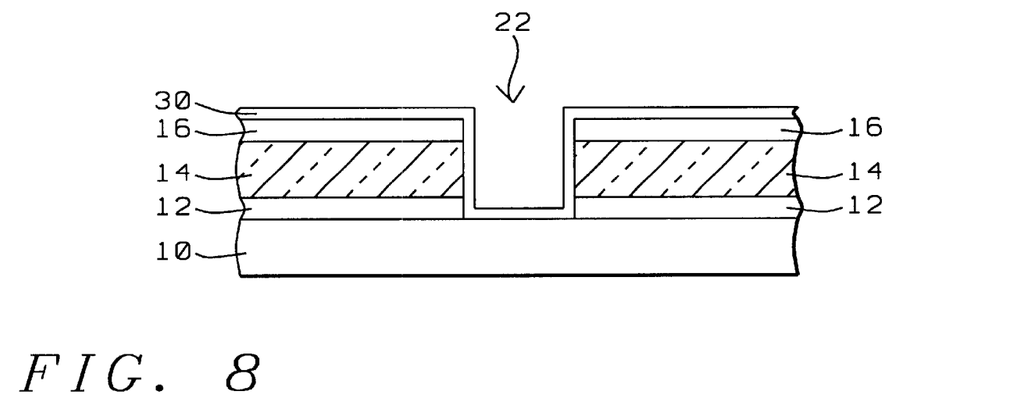
FIG. 8 shows a cross section after a thin layer of CVD oxide has been deposited over the structure that is shown in cross section in FIG. 4.

The invention will next be described in detail using FIGS. 8 through 11. It must in this be understood that FIGS. 1 through 4 continue to apply to the instant invention and that it is therefore assumed that FIGS. 1 through 4 precede the process flow that starts with FIG. 8. The cross section that immediately precedes the cross section of FIG. 8 is therefore the cross section that is shown in FIG. 4.

Processing steps that relate to FIGS. 1 through 4 will be further detailed at this time.

The deposition of the layer 12 of etch stop layer can use any suitable etch stop material such as silicon nitride. Silicon nitride is frequently used as a passivation layer due to its ability to provide an impermeable barrier to moisture and mobile impurities (e.g. sodium ions). Silicon nitride also forms a tough coating that protects an underlying integrated circuit against mechanical damage.

The etch stop layer 12 of silicon nitride ($Si_3Ni_4$) can be deposited using PECVD procedures at a pressure between about 200 mTorr and 400 mTorr, at a temperature between about 350 and 450 degrees C., to a thickness of about 1000 to 5000 Angstrom using $NH_3$ and $SiH_4$ or $SiCl_2H_2$. The silicon nitride layer 12 can also be deposited using LPCVD or PECVD procedures using a reactant gas mixture such as dichlorosilane: ($SiCl_2H_2$) as a silicon source material and amonia ($NH_3$) as a nitrogen source, at a temperature between about 600 and 800 degrees C., at a pressure between about 300 mTorr and 400 mTorr, to a thickness between about 200 and 300 Angstrom.

Layer 14 of dielectric can contain any suitable dielectric such as for instance silicon dioxide ("oxide", doped or undoped) or silicon nitride ("nitride"), silicon oxynitride, fluoropolymer, parylene, polyimide, tetra-ethyl-ortho-silicate (TEOS) based oxides, boro-phosphate-silicate-glass (BPSG), phospho-silicate-glass (PSG), boro-silicate-glass (BSG), oxide-nitride-oxide (ONO), a low dielectric constant material, such as hydrogen silsesquioxane and HDP-FSG (high-density-plasma fluorine-doped silicate glass.

The most commonly used and therefore the preferred dielectrics that can be used for the deposition of layer 14 are silicon dioxide (doped or undoped), silicon oxynitride, parylene or polyimide, spin-on-glass, plasma oxide or LPCVD oxide. The preferred dielectric material to be used for the invention is $SiO_2$.

The deposition of the layers 14 of dielectric uses conventional deposition technology and can, for instance, be deposited using LPCVD, PECVD, or APCVD procedures at a temperature of between about 350 and 450 degrees C. to a thickness between about 5000 and 10,000 Angstrom using TEOS as a source.

Layer 16 of hard mask material can contain any of the conventional hard mask materials such as nickel, aluminum or gold and can be deposited using methods of CVD or sputtering to a thickness between about 100 and 500 Angstrom. One method of forming a hard mask is for instance the deposition of a layer of titanium or titanium nitride or a layer of amorphous silicon, which a sputter deposited to a thickness of between about 100 and 400 Angstrom. As another example of the creation of a hard mask layer 16 can be cited the use of nitride which can be deposited using methods of LPCVD, PECVD, HDCVD, sputtering or high density plasma CVD (HDPCVD) whereby layer 16 can be deposited to a thickness between about 100 and 500 Angstrom. For the etching of the opening 20 in layer 16 (FIG. 2), magnetic enhanced reactive ion etching can be used using $CH_3F$ as an etchant, thus avoiding damage to the underlying layer 14 of dielectric.

The layer 18 of photoresist is spin coated over the surface of the hard mask layer 16 patterned as shown: Opening 20 created in the layer 18 of photoresist aligns with the point of electrical contact (not shown) that have been provided in the surface of layer 10. The layer 22 of photoresist can be etched by applying $O_2$ plasma and then wet stripping by using $H_2SO_4$, $H_2O_2$ and $NH_4OH$ solution.

A photoresist developer often used during development of the photoresist is tetramethyl ammonium hydroxide (TMAH). Other developers such as sodium hydroxide, sodium metasillicide or potassium hydroxide may also be used. However, one of the properties of TMAH relative to other developers is that it is a metal-ion free developer, which reduces metal-ion diffusion and contamination in other parts of the IC.

Photoresist stripping frequently applies sulfuric acid ($H_2SO_4$) and mixtures of $H_2SO_4$ with other oxidizing agents such as hydrogen peroxide ($H_2O_2$) For instance, a frequently used mixture is seven parts $H_2SO_4$ to three parts of 30% $H_2O_2$ or a mixture of 88% sulfuric acid and 12% nitric acid. Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

The etching of layer 14 of dielectric applies anisotropic, RIE processing and typically uses $CHF_3$ as an etchant.

The etching of etch stop layer 12 of silicon nitride, shown in FIG. 2, can be performed using a SiON or SiN removal process with etchant gasses $CH_3F/Ar/O_2$ at a temperature between about 10 and 20 degrees C., a pressure of between about 50 and 60 mTorr with an etch time of between about 40 and 60 seconds. Openings in the layer of nitride can be anisotropically etched with a plasma gas containing fluor carbon gases such as $CF_4/CHF_3$ or $SF_6$—$O_2$ chemistry or $Co/C_4F_8$ chemistry, in a commercial RIE etcher or an electron cyclotron resonance (ECR) plasma reactor. A frequently applied method of removing silicon nitride is an isotropic wet etch process using hot phosphoric acid. The silicon nitride layer 11 can also be dipped into phosphoric acid ($H_3PO_4$) to be removed.

Returning now specifically to FIG. 8, FIG. 8 continues the processing sequence that has previously been described using FIGS. 1 through 4. FIG. 8 shows a critical processing step of the invention whereby a thin layer 30 of CVD oxide has been deposited over the surface of the hard mask layer 16 and the inside surfaces of the opening 22 that has been created in the layer 14 of dielectric and the etch stop layer 12. This layer 30 of oxide will, due to the profile-of the opening 22 (which is further highlighted in one of the subsequent cross sections of FIGS. 12 through 18 that more correctly reflect actual cross sections) mostly be deposited as only a very thin layer over the surfaces that are parallel with the surface of layer 10, that is over the bottom of opening 22 and over the surface of the hard mask layer 16. Due to the sloping sidewalls of opening 22, a sloping that is more pronounced when proceeding from the bottom of the opening 22 to the upper regions of the opening 22 where this opening 22 intersects with the surface of the surrounding dielectric, the CVD oxide will be deposited as a thicker layer around the upper regions of the sidewall of opening 22. This is key and fundamental to the instant invention since this deposition profile leads to significantly improved upper regions of the opening 22, resulting in optimized Critical Dimension of the hole diameter where the hole exits the layer 14 of dielectric and the hard mask layer 16. This deposition profile will further enhance the previously stated objective of creating openings that have nearly vertical walls, since the deposited thin layer of CVD oxide will accumulate most significantly in places where the sidewalls of the opening 22 have the greatest deviation from a perfectly vertical profile. In addition, the layer of deposited CVD oxide is readily removed from (horizontal surfaces) where this layer is not desired to be present, this removal takes place during the following step of pre-barrier metal argon sputter.

The deposition of layer 30 of CVD oxide can be used for the application that is shown in FIG. 8 because CVD oxide has a high deposition rate and it is essentially free from particles from deposition chamber walls. Also, CVD oxide does not have metallic contamination and produces films that have lower stress. It must thereby however be realized that for effective deposition a high density of low-energy ions is needed.

The deposition of the layer 30 of thin oxide can use conventional deposition technology and can, for instance, be deposited using PECVD procedures using TEOS as a source at a flow rate between about 80 and 100 sccm, a temperature between about 680 and 730 degrees C., pressure between about 240 and 260 mTorr, processing chamber used is an LP system, time of deposition about 60 minutes.

By now referring back to FIG. 9, the process is continued with the step of pre-barrier metal argon sputter of layer 24, FIG. 9 and the deposition of a barrier layer 26 over the surface of layer 24. The process further completes the creation of a metal plug by depositing a layer 28 of metal over the surface of the barrier layer 26, FIG. 10 and polishing this layer 28 of metal down to the surface of the hard mask layer 16, FIG. 11.

The step of pre-barrier metal argon sputter of layer 24 can use argon as an etchant at a temperature of between about 120 and 160 degrees C. and a pressure of between about 0.30 and 0.40 Torr for a time of between about 33 and 39 seconds using a dry etch process.

Figure 9:
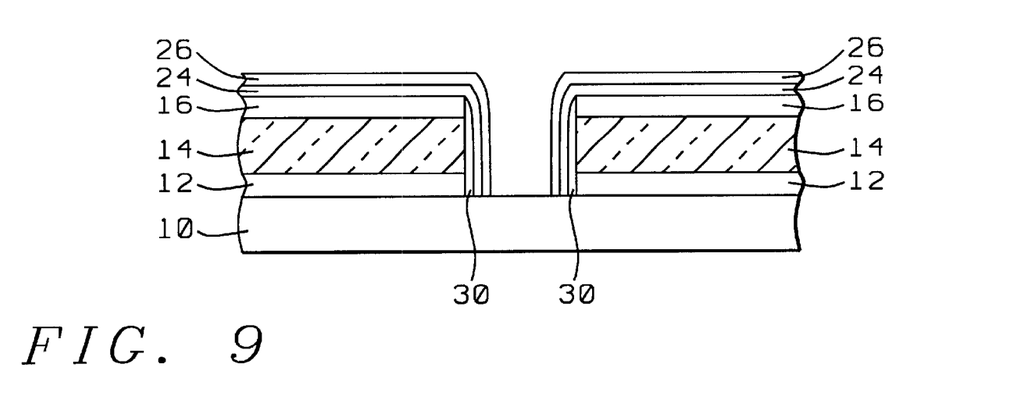
FIG. 9 shows a cross section after a pre-metal barrier sputter has been performed to the structure of FIG. 8, a barrier layer has also been deposited.
Figure 10:
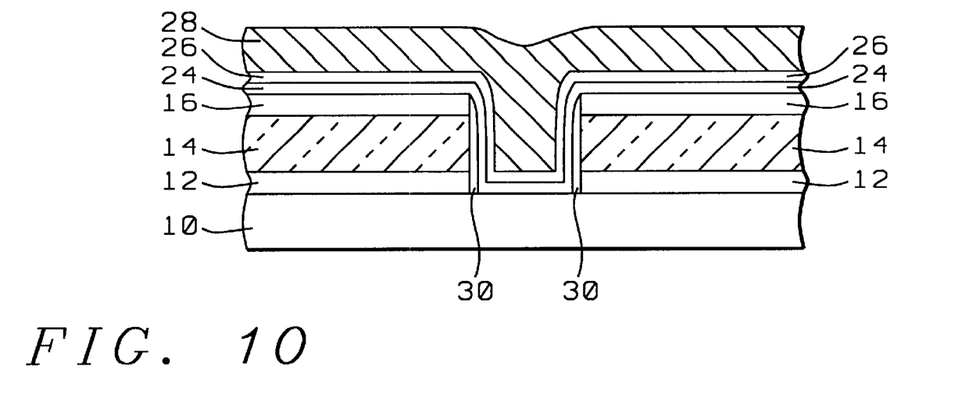
FIG. 10 shows a cross section after a layer of metal has been deposited over the surface of the structure of FIG. 9.
Figure 11:
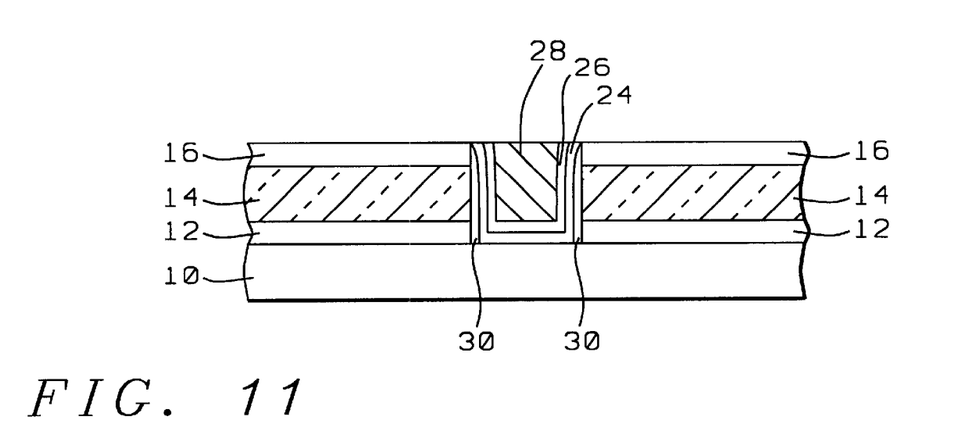
FIG. 11 shows a cross section after the deposited layer of metal has been polished down to the surface of the hard mask layer.

Barrier layers, such as layer 26, FIG. 9, are typically used to prevent diffusion of the interconnect metal into surrounding layers of dielectric and silicon. Some of the considerations that apply in selecting a material for the barrier layer become apparent by using copper for interconnect metal as an example. Although copper has a relatively low cost and low resistivity, it has a relatively large diffusion coefficient into silicon dioxide and silicon and is therefore not typically used as an interconnect metal. Copper from an interconnect may diffuse into the silicon dioxide layer causing the dielectric to be conductive and decreasing the dielectric strength of the silicon dioxide layer. Copper interconnects should be encapsulated by at least one diffusion barrier to prevent diffusion into the silicon dioxide layer. Silicon nitride is a diffusion barrier to copper, but the prior art teaches that the interconnects should not lie on a silicon nitride layer because it has a high dielectric constant compared with silicon dioxide. The high dielectric constant causes a desired increase in capacitance between the interconnect and the substrate.

A typical diffusion barrier layer may contain silicon nitride, phosphosilicate glass (PSG), silicon oxynitride, aluminum, aluminum oxide ($Al_xO_y$), tantalum, Ti/TiN or Ti/W, niobium, or molybdenum and is more preferably formed from TiN. The barrier layer can also be used to improve the adhesion of the subsequent overlying tungsten layer.

A barrier layer is preferably about 100 and 500 angstrom thick and more preferably about 300 angstrom thick and can be deposited using rf sputtering.

FIGS. 12 through 18 are shown in order to show more clearly the results that are obtained by the invention. These figures have been created using actual cross sections of the creation of a hole through a layer of dielectric at various stages during this process. no further details of processing will be provide with these FIGS. 12 through 18 since these details have previously been discussed.

Figure 12:
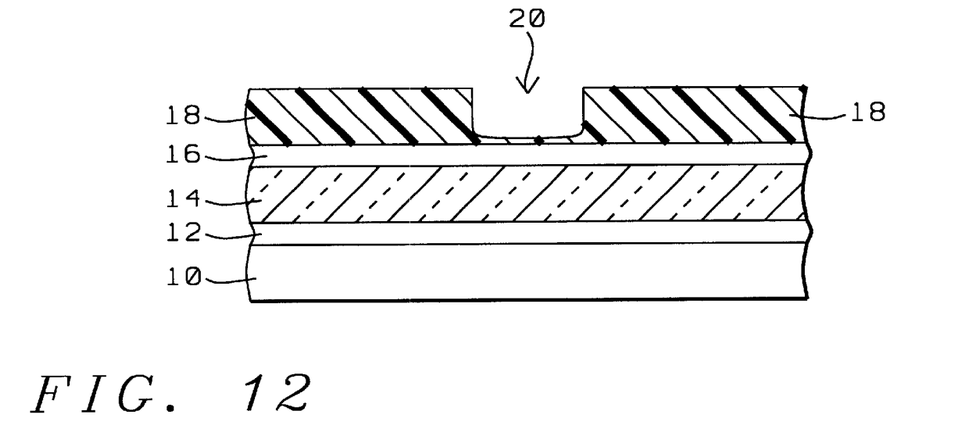
FIG. 12 shows a cross section that equates with FIG. 1, that is after the layer of photoresist has been patterned and etched.

FIG. 12 shows a cross section that equates with FIG. 1, that is the various layers have been deposited and the layer 18 of photoresist has been patterned and etched creating opening 20 in the layer 18 of photoresist.

Figure 13:
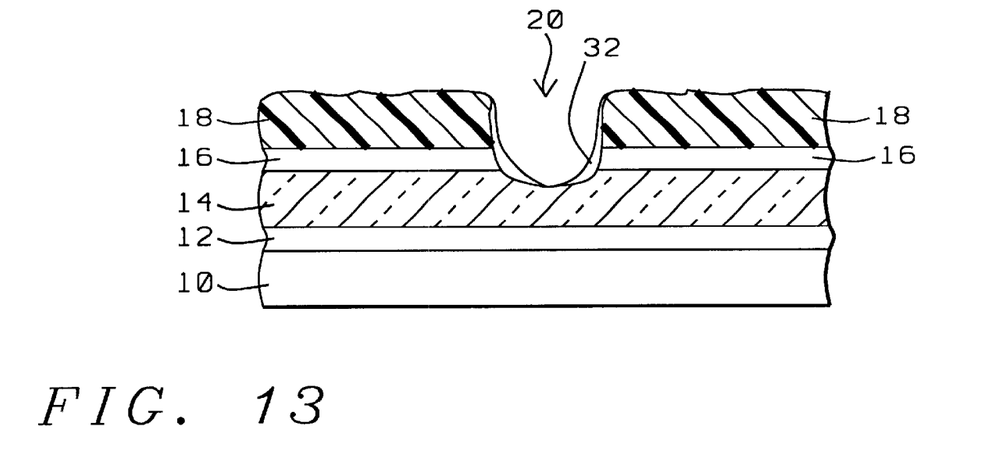
FIG. 13 shows a cross section that equates with FIG. 2, that is after the hard mask layer has been etched.

FIG. 13 equates with FIG. 2, that is an opening has been etched in the hard mask layer in accordance with opening 20 that has been created in the layer 18 of photoresist. It can been seen that the etch of the layer of hard mask material actually penetrates the layer 14 of dielectric while processing residue 32 has accumulated on the inside surfaces of the opening 20.

Figure 14:
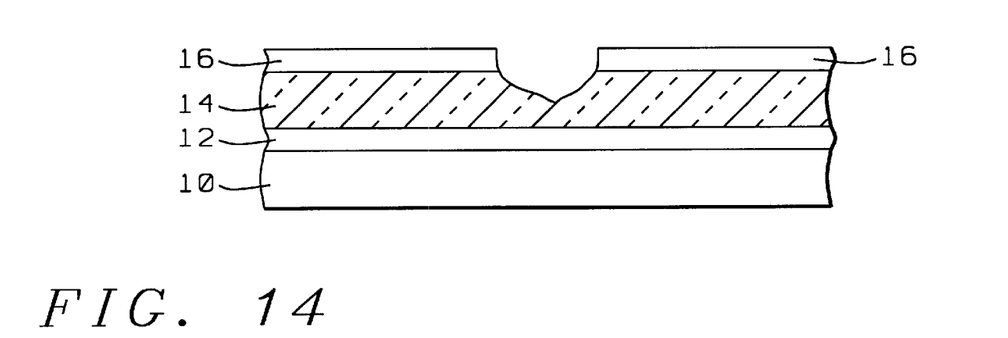
FIG. 14 shows a cross section that equates with FIG. 3, that is after the patterned layer of photoresist has been removed.

FIG. 14 equates with FIG. 3, the patterned layer 18 of photoresist has been removed at the same time that the residues 32 have been removed from the surfaces of opening 20.

Figure 15:
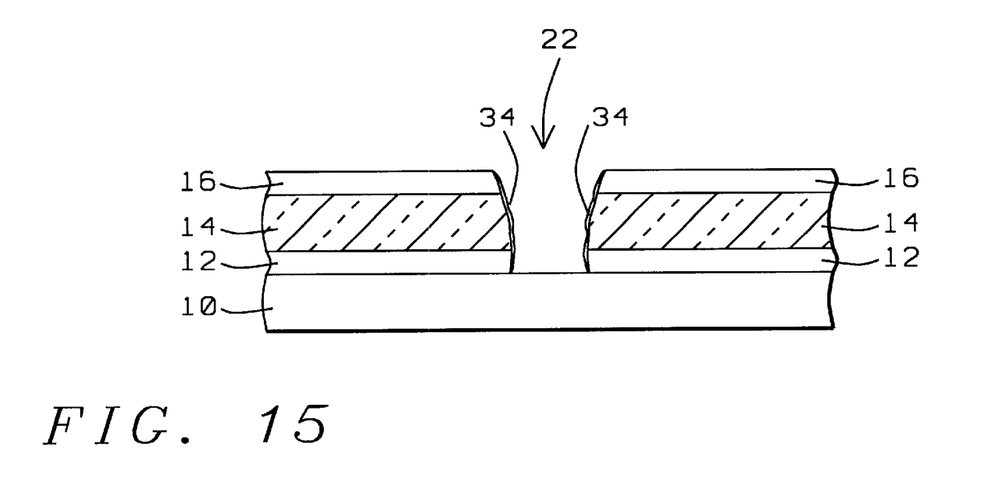
FIG. 15 shows a cross section that equates with FIG. 4, that is after the layer of dielectric and the etch stop layer have been etched.

FIG. 15 equates with FIG. 4, the opening 22 has been etched through the layer 14 of dielectric and has been further extended through the etch stop layer 12. Shown in the cross section of FIG. 15 is a liner of undesirable processing residue 34 that remains in place on the sidewalls of opening 22.

Figure 16:
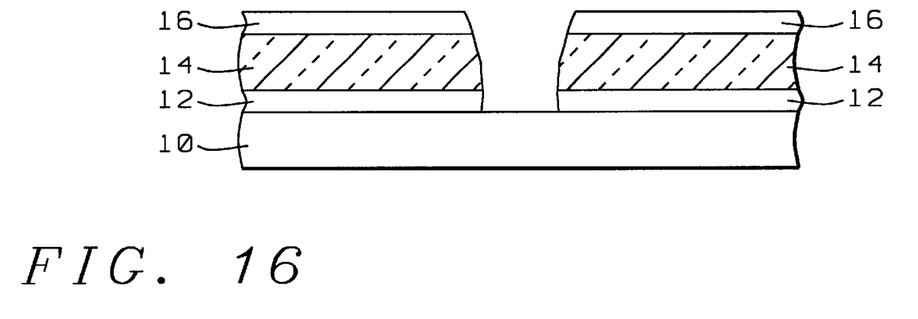
FIG. 16 shows a cross section that further equates with FIG. 4, that is after the etch stop layer has been etched and after a clean that has removed residue from the walls of the opening.

FIG. 16 still equates with FIG. 4, in the cross section that is shown in FIG. 16 the liner 34 has been removed by a thorough clean and rinse of the surface.

Figure 17:
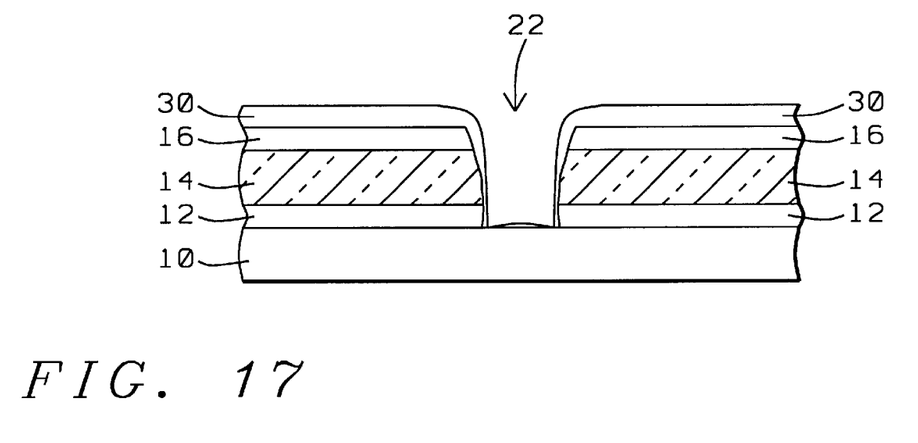
FIG. 17 is a cross section that equates with FIG. 8, that is after a thin layer of oxide has been deposited.

FIG. 17 equates with FIG. 8, in the cross section of FIG. 17 the slope of the upper extremities of the sidewalls of the opening 22 is more clearly visible. This sloping is undesirable since it widens the upper diameter of the opening 22 and since it detracts from having sidewalls of opening 22 that are as vertical as possible. Clearly visible in the cross section of FIG. 17 is that the thin layer 30 of oxide is thickest on the surface of the hard stop layer 16 from where, when proceeding towards opening 22, the thickness of the deposited layer of CVD oxide gradually decreases to the point where almost no CVD oxide is present on the bottom of opening 22.

Figure 18:
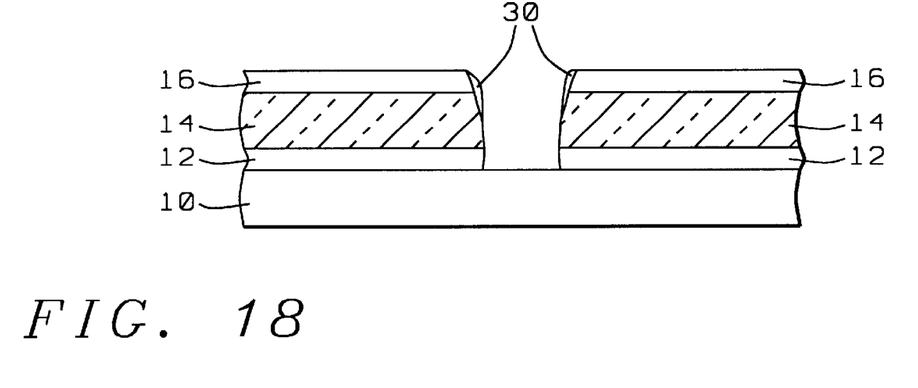
FIG. 18 shows a cross section that partially equates with FIG. 9, that is after the pre-metal sputter has been performed.

FIG. 18 partially equates with FIG. 9 and shows layer 30 of FIG. 9 after the pre-barrier argon sputter has been completed. This pre-argon sputter has removed all of the CVD oxide from the surface of the hard mask layer 16 and from the bottom of opening 22. In addition, the pre-barrier argon sputter has reduced the thickness of the CVD oxide by a measure around the upper perimeter of opening 22 but has left enough of the CVD oxide in place, that is layers 30. The remaining layer 30 of the CVD oxide, FIG. 18, narrows the upper diameter of opening 22, providing improved CD control and providing the ability to maintain a dense pattern of openings and further making the sidewalls of opening 22 more vertical.

The invention, providing a method for forming a contact hole on a semiconductor substrate, can be summarized as follows:

providing a semiconductor substrate, an etch stop layer having been deposited on the surface of the substrate, a layer of dielectric having been deposited on the surface of the etch stop layer, a layer of hard mask material having been deposited on the surface of the layer of dielectric, a layer of photoresist having been deposited on the surface of the layer of hard mask material, the layer of photoresist comprising a hole performing a first anisotropic etching process in a downward direction to remove the layer of hard mask material under the hole down to the surface of the layer of dielectric to form a hole in the layer of hard mask material removing the layer of photoresist from the surface of the layer of hard mask material performing a second anisotropic etching process in a downward direction to remove the layer of dielectric under the hole down in the layer of hard mask material to the surface of the layer of etch stop to form a recess having sidewalls and a bottom in the layer dielectric wherein polymer material remains at the bottom and the sidewalls of the recess following this second anisotropic etching process performing an in-situ plasma cleaning process to entirely remove the polymer material remaining at the bottom and the sidewalls of the recess performing a third in-situ anisotropic etching process in a downward direction to remove the layer of etch stop from the bottom of the recess created in the layer of dielectric down to the surface of the substrate to form a contact hole having sidewalls and a bottom surface in addition to having an orifice depositing in a downward direction a thin layer of oxide over the surface of the layer of hard mask material whereby the thin layer of oxide is deposited on the sidewalls and bottom surface of the contact hole, and performing a pre-barrier metal sputter of the thin layer of oxide, removing the thin layer of oxide from the surface of the layer of hard mask material and the bottom of the contact hole, further partially removing the thin layer of oxide from the sidewalls of the contact hole, the removal of the thin layer of oxide from the sidewalls of the contact hole being highest at the orifice of the contact hole and gradually declining when proceeding from the orifice towards the bottom of the contact hole.

It must thereby be realized that, for purposes of processing efficiency, steps of first anisotropic etching process, of removing the layer of photoresist, of second anisotropic etching process, of in-situ plasma cleaning process and of performing a third in-situ anisotropic etching process can be completed in one apparatus.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for forming a contact hole on a semiconductor substrate, an etch stop layer having been deposited on the surface of said substrate, a layer of dielectric having been deposited on the surface of the etch stop layer, a layer of hard mask material having been deposited on the surface of the layer of dielectric, a layer of photoresist having been deposited on the surface of the layer of hard mask material, the layer of photoresist comprising a hole, comprising the steps of:

performing a first anisotropic etching process in a downward direction to remove the layer of hard mask material under the hole down to the surface of the layer of dielectric to form a hole in the layer of hard mask material;

removing the layer of photoresist from the surface of the layer of hard mask material;

performing a second anisotropic etching process in a downward direction to remove the layer of dielectric under the hole down in the layer of hard mask material to the surface of the layer of etch stop to form a recess having sidewalls and a bottom in the layer dielectric wherein polymer material remains at the bottom and the sidewalls of the recess following this second anisotropic etching process;

performing an in-situ plasma cleaning process to entirely remove the polymer material remaining at the bottom and the sidewalls of the recess;

performing a third in-situ anisotropic etching process in a downward direction to remove the layer of etch stop from the bottom of the recess created in the layer of dielectric down to the surface of the substrate to form a contact hole having sidewalls and a bottom surface in addition to having an orifice;

depositing in a downward direction a thin layer of oxide over the surface of the layer of hard mask material whereby said thin layer of oxide is deposited on the sidewalls and bottom surface of the contact hole; and performing a pre-barrier metal sputter of the thin layer of oxide, removing the thin layer of oxide from the surface of the layer of hard mask material and the bottom of the contact hole, further partially removing the thin layer of oxide from the sidewalls of the contact hole, said removal of the thin layer of oxide from the sidewalls of the contact hole being highest at the orifice of the contact hole and gradually declining when proceeding from the orifice towards the bottom of the contact hole, said step of pre-barrier metal argon sputter using argon as an etchant at a temperature of between about 120 and 160 degrees C. and a pressure of between about 0.30 and 0.40 Torr for a time of between about 33 and 39 seconds using a dry etch process.

2. The method of claim 1, said layer of etch stop material comprising oxynitride or silicon nitride.

3. The method of claim 1, said hard mask layer comprising an element selected from the group consisting of oxynitride and titanium nitride and amorphous silicon deposited to a thickness between about 100 and 500 Angstrom.

4. The method of claim 1, said hard mask layer comprising oxynitride deposited using methods of LPCVD or PECVD or HDCVD or sputtering or high density plasma CVD (HDPCVD) deposited to a thickness between about 100 and 500 Angstrom.

5. The method of claim 1, said thin layer of oxide comprising a layer of Plasma Enhanced Chemical Mechanical Deposited (PECVD) oxide, deposited to a thickness between about 100 and 200 Angstrom.

6. The method of claim 1 wherein said first anisotropic etching process and said removing the layer of photoresist are completed in one apparatus.

7. The method of claim 6 wherein said a second anisotropic etching process is also completed in the apparatus.

8. The method of claim 7 wherein said in-situ plasma cleaning process is also completed in the apparatus.

9. The method of claim 8 wherein said performing a third in-situ anisotropic etching process is also completed in the apparatus.

10. The method of claim 1 wherein the contact hole is used forming a borderless contact plug.

11. The method of claim 1 wherein said plasma cleaning is an in-situ plasma cleaning process or a wet plasma cleaning.

12. The method of claim 1 with additional steps of:

depositing a barrier layer over the surface of the hard mask layer, including inside surfaces of the contact hole;

depositing a layer of conducting material over the surface of the barrier layer; and polishing the surface of the deposited layer of conducting down to the surface of the hard mask layer using methods of Chemical Mechanical Polishing.

13. A method for forming a contact hole on a semiconductor substrate, an etch stop layer having been deposited on the surface of said substrate, a layer of dielectric having been deposited on the surface of the etch stop layer, a layer of hard mask layer material having been deposited on the surface of the layer of dielectric, a layer of photoresist having been deposited on the surface of the layer of hard mask material, the layer of photoresist comprising a hole, comprising the steps of:

performing a first anisotropic etching process in a downward direction to remove the layer of hard mask material under the hole down to the surface of the layer of dielectric to form a hole in the layer of hard mask material, wherein polymer material remains at the bottom and the sidewalls of the hole in the layer of hard mask;

performing a first in-situ plasma cleaning process to entirely remove the polymer material remaining at the bottom and the sidewalls of the hole in the layer of hard mask;

performing a second anisotropic etching process in a downward direction to remove the layer of dielectric under the hole down in the layer of hard mask material to the surface of the layer of etch stop to form a recess in the layer of dielectric wherein polymer material remains at the bottom and the sidewalls of the recess following this second anisotropic etching process;

performing a second in-situ plasma cleaning process to entirely remove the polymer material remaining at the bottom and the sidewalls of the recess in the layer of dielectric;

performing a third in-situ anisotropic etching process in a downward direction to remove the layer of etch stop from the bottom of the recess created in the layer of dielectric down to the surface of the substrate to form a contact hole having sidewalls and a bottom surface in addition to having an orifice;

depositing in a downward direction a thin layer of oxide over the surface of the layer of hard mask material whereby said thin layer of oxide is further deposited on the sidewalls and bottom surface of the contact hole;

performing a pre-barrier metal sputter of the thin layer of oxide, removing the thin layer of oxide from the surface of the layer of hard mask material and the bottom of the contact hole, further partially removing the thin layer of oxide from the sidewalls of the contact hole, said removal of the thin layer of oxide from the sidewalls of the contact hole being highest at the orifice of the contact hole and gradually decreasing when proceeding from the orifice towards the bottom of the contact hole, said step of pre-barrier metal argon sputter using argon as an etchant at a temperature of between about 120 and 160 degrees C. and a pressure of between about 0.30 and 0.40 Torr for a time of between about 33 and 39 seconds using a dry etch process.

14. The method of claim 13 wherein said layer of photoresist is also removed during the first in-situ cleaning process.

15. The method of claim 13, said layer of etch stop material comprising a layer of oxynitride or silicon nitride.

16. The method of claim 13, said hard mask layer comprising an element selected from the group consisting of oxynitride and titanium nitride and amorphous silicon deposited to a thickness between about 100 and 500 Angstrom.

17. The method of claim 13, said hard mask layer comprising oxynitride deposited using methods of LPCVD or PECVD or HDCVD or sputtering or High Density Plasma CVD (HDPCVD) deposited to a thickness between about 100 and 500 Angstrom.

18. The method of claim 13, said thin layer of oxide comprising a layer of Plasma Enhanced Chemical Mechanical Deposited (PECVD) oxide, deposited to a thickness between about 100 and 200 Angstrom.

19. The method of claim 13 wherein said first anisotropic etching process and said removing the layer of photoresist are completed in one apparatus.

20. The method of claim 19 wherein said a second anisotropic etching process is also completed in the apparatus.

21. The method of claim 20 wherein said in-situ plasma cleaning process is also completed in the apparatus.

22. The method of claim 21 wherein said performing an in-situ third anisotropic etching process is also completed in the apparatus.

23. The method of claim 13 wherein the contact hole is used forming a borderless contact plug.

24. The method of claim 13 wherein said first plasma cleaning is an in-situ plasma cleaning process or a wet plasma cleaning.

25. The method of claim 13 wherein said second plasma cleaning is an in-situ plasma cleaning process or a wet plasma cleaning.

26. The method of claim 13 with additional steps of:
depositing a barrier layer over the surface of the hard mask layer, including inside surfaces of the contact hole;
depositing a layer of conducting material over the surface of the barrier layer; and
polishing the surface of the deposited layer of conducting down to the surface of the hard mask layer using methods of Chemical Mechanical Polishing.

* * * * *